United States Patent [19]
Nakano

[11] 4,081,697
[45] Mar. 28, 1978

[54] SEMICONDUCTOR MEMORY DEVICE

[75] Inventor: Takao Nakano, Itami, Japan

[73] Assignee: Mitsubishi Denki Kabushiki Kaisha, Tokyo, Japan

[21] Appl. No.: 639,237

[22] Filed: Dec. 9, 1975

[30] Foreign Application Priority Data
Dec. 16, 1974 Japan .................. 49-144771

[51] Int. Cl.² .............. H01L 27/10; G11C 11/40
[52] U.S. Cl. .............................. 365/154; 307/238; 357/35; 357/36; 357/44; 357/45; 357/46; 365/174
[58] Field of Search .............. 357/35, 36, 44, 46; 307/291, 238; 340/173 FF

[56] References Cited
U.S. PATENT DOCUMENTS

| | | | |
|---|---|---|---|
| 3,502,951 | 3/1970 | Hunts | 357/44 |
| 3,663,872 | 5/1972 | Yanagawa | 357/35 |
| 3,676,755 | 7/1972 | Glaise | 357/38 |
| 3,913,123 | 10/1975 | Masaki et al. | 357/44 |

OTHER PUBLICATIONS

Wiedmann, 1973 IEEE Intercon Technical Papers, vol. 6, Session 30, paper no. 30-4 (pp. 1-2).
Nakano et al., "Vertical Injection Logic", IEEE International Electron Devices Meeting, Technical Digest, Dec. 1975 (pub. Nov. 30, 1975) pp. 555-558.

Primary Examiner—William D. Larkins
Attorney, Agent, or Firm—Wenderoth, Lind & Ponack

[57] ABSTRACT

The disclosed semiconductor memory device has a multiplicity of memory cells disposed in rows and columns. Each memory cell includes two transistors extending in the thickness direction of the device for storing and interconnected into a flip-flop, two lateral transistors for performing the reading-out and writing-in operations respectively and two lateral transistors for addressing. Each of the lateral transistors includes an L-shaped emitter opposed to the base and collector of the associated thickness direction transistor lengthwise of the semiconductor substrate involved and also in the direction of thickness thereof.

12 Claims, 16 Drawing Figures (PRIOR ART)
FIG.1

SEMICONDUCTOR MEMORY DEVICE

BACKGROUND OF THE INVENTION

This invention relates to improvements in a semiconductor memory device having an integrated injection logic (which is abbreviated hereinafter to "IIL") configuration including NPN transistors and PNP transistors in a composite form.

In order to fulfil the requirements of a high density and a high integration, semiconductor memory devices have been principally formed by employing MOS integrated circuits having MOS transistors assembled thereinto for the reasons that the isolation of elements involved is not required and the manufacturing steps are simple and so on. On the other hand, bipolar integrated circuits having bipolar transistors assembled thereinto have been infrequently employed to form semiconductor memory devices. However, when manufacturing bipolar integrated circuits, the control of base width is easy as compared with the control of the channel length of MOS transistors. This is accompanied by the facilitation of high speed production and also a decrease in problems concerning the production. If the problem of isolating the semiconductor elements involved from one another is solved, and if the manufacturing steps can be simplified then it is expected that bipolar integrated circuits will be widely used for semiconductor memory devices.

Semiconductor memory devices with the IIL configuration are of the bipolar type including bipolar integrated circuits in order to isolate semiconductor elements involved from one another and simplify the manufacturing steps therefor. Such bipolar semiconductor memory devices include an injection coupled memory cell having common base PNP transistors and common emitter NPN transistors in composite form.

In semiconductor memory devices with that IIL configuration the structure by which the semiconductor elements involved are isolated from one another can be simplified and the electrical interconnection between the semiconductor elements can be made by a simple wiring pattern. Thus those semiconductor memory devices are advantageous in that the manufacturing process can be simpler than that for an integrated circuit having general bipolar transistors assembled thereinto. Semiconductor memory devices with the IIL configuration which have been proposed have included the lateral transistor assembled into the longitudinal transistor. However it has been difficult to obtain a high performance from such conventional semiconductor memory devices because the lateral transistor has a low in efficiency for injection of carriers and the frequency characteristic thereof is poor.

Accordingly it is an object of the present invention to provide a new and improved semiconductor memory device which is highly efficient in performance and including transistors having a high efficiency of injection of carriers and having a good frequency characteristic.

SUMMARY OF THE INVENTION

The present invention provides a semiconductor memory device including at least one memory cell having a flip-flop circuit formed of a first and a second transistor to perform the storing operation, and a third and a fourth transistor for performing the reading-out operation and/or the writing-in operation with respect to said memory cell, which device comprises a substrate of semiconductive material having a pair of main opposite faces, and including a first semiconductor region of a first type conductivity disposed therein so as to be exposed to one of the main faces, a second semiconductor region and a third semiconductor region having a second type conductivity and disposed in the substrate so as to be exposed to the one main face, each of said second and third semiconductor regions forming a junction between the same and the first semiconductor region, a fourth semiconductor region of the first type conductivity disposed in said substrate so as to be exposed to the one main face to form a junction between the same and the second semiconductor region, a fifth semiconductor region of the first type conductivity disposed in the substrate so as to be exposed to the one main face to form a junction between the same and the third semiconductor region, a sixth semiconductor region of the second type conductivity disposed in the substrate and including a portion opposed to the second semiconductor region through the first semiconductor region in the direction of the thickness of the substrate, and a seventh semiconductor region of the second type conductivity disposed in the substrate and including a portion opposed to the third semiconductor region through said first semiconductor region in the direction of the thickness of the substrate, the first, second and fourth semiconductor regions forming the first transistor, the first, third and fifth semiconductor regions forming the second transistor, the first, second and sixth semiconductor regions forming the third transistor, and the first, third and seventh semiconductor regions forming the fourth transistor.

Preferably each of the sixth and seventh semiconductor regions includes a second portion extending from the portion thereof opposite to the second or third semiconductor region to the one main face of the substrate thereby to be opposed to the second or third semiconductor region through the first semiconductor region along the one main face of the substrate.

BRIEF DESCRIPTION OF THE DRAWINGS

The present invention will become more readily apparent from the following detail description taken in conjunction with the accompanying drawings in which.

DESCRIPTION OF THE PREFERRED EMBODIMENTS

Figure 1:
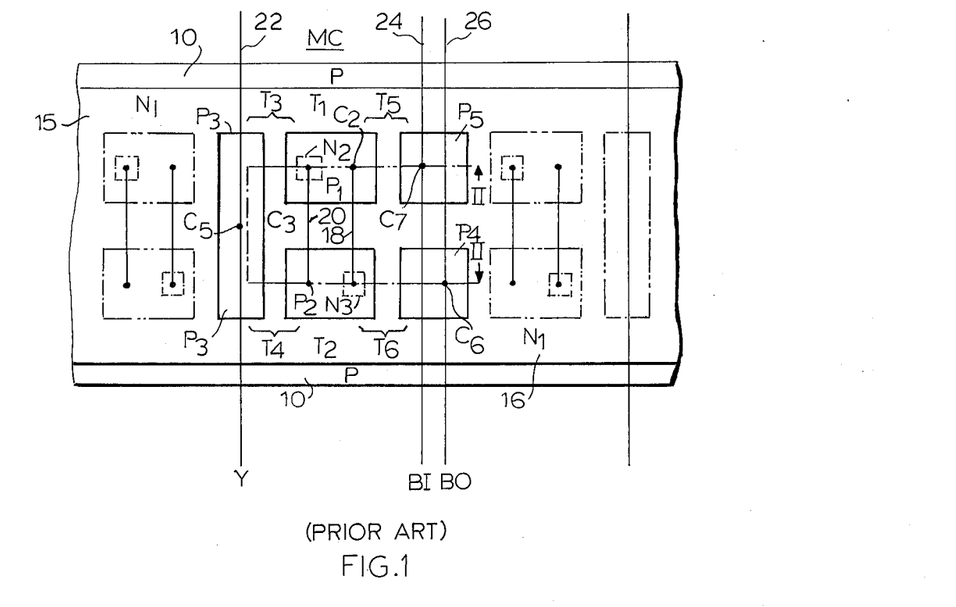
FIG. 1 is a fragmental plan view of a semiconductor memory device with an IIL configuration constructed in accordance with the principles of the prior art.

For a better understanding of the nature of the present invention, a conventional semiconductor memory device with an IIL configuration will now be described in conjunction with FIGS. 1 and 2 of the drawings. The arrangement illustrated comprises a P type semiconductor substrate 10, an $N^+$ type semiconductor layer 14 and a first N type semiconductor layer 16 or $N_1$ superposed on one another in the named order. As best shown in FIG. 1, the first N type semiconductor layer 14 includes a multiplicity of arrays of five P type semiconductor regions $P_1$, $P_2$, $P_3$, $P_4$ and $P_5$ disposed in tandem thereon. The arrays of the five P type semiconductor regions are formed in the same predetermined pattern on the first N type semiconductor layer 16 by selectively diffusing a P type impurity into the exposed surface of the layer 16. A first one of the P type semiconductor regions $P_1$ is aligned with and spaced from a second one of the P type semiconductor region $P_2$ widthwise of the $N^+$ type layer 16 or in the transverse direction as viewed in FIG. 1. The first and second regions $P_1$ and $P_2$ have the third semiconductor region $P_3$ elongated in the longitudinal direction in spaced relationship to one side thereof, in this case, the left sides thereof as viewed in FIG. 1 and the fifth and fourth semiconductor regions $P_5$ and $P_4$ aligned with and spaced from the respective regions $P_1$ and $P_2$ lengthwise of the first N type semiconductor layer 16 on the other or righthand sides thereof. All the P type regions form respective PN junctions with the N type layer 16.

The elongated semiconductor region $P_3$ is common to its own array and the adjacent array positioned to its left while the semiconductor regions $P_4$ and $P_5$ are common to their own array and the adjacent array positioned to their right.

Then an N type impurity is diffused into a selected portion of each of the first and second P type semiconductor regions $P_1$ and $P_2$ to form a second or a third N type semiconductor region $N_2$ or $N_3$ with a PN junction formed it and the respective P type semiconductor regions. In FIG. 1 the second N type semiconductor region $N_2$ is shown as being disposed adjacent to the P type semiconductor region $P_3$ on the P type region $P_1$ while the third N type semiconductor region $N_3$ is shown as being disposed adjacent to the P type semiconductor region $P_4$ on the P type semicondcutor region $P_2$.

It is noted that FIG. 1 shows a single array of the P type semiconductor regions $P_1$, $P_2$, $P_3$, $P_4$ and $P_5$ in solid lines only for purposes of illustration.

Figure 2:
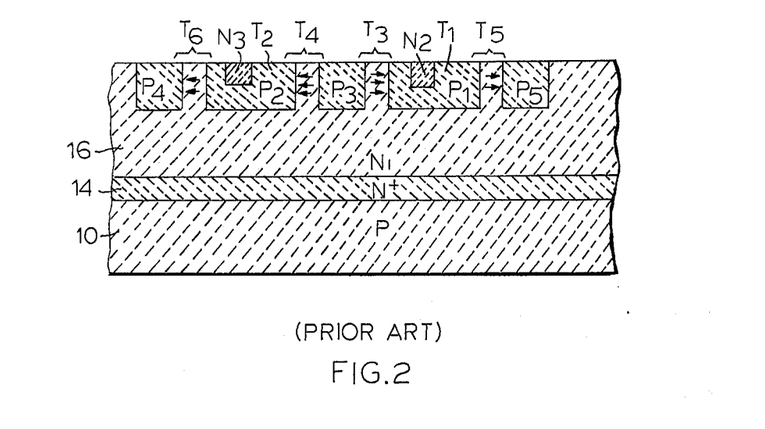
FIG. 2 is a fragmental sectional view as taken along the line II — II of FIG. 1 and developed in a plane.

From FIGS. 1 and 2 it will readily be seen that the five P type semiconductor regions $P_1$, $P_2$, $P_3$, $P_4$ and $P_5$ form six bipolar transistors $T_1$, $T_2$, $T_3$, $T_4$, $T_5$ and $T_6$ with both the two N type semiconductor regions $N_2$ and $N_3$ and the $N^{30}$ type semiconductor layer 14. Those six transistors form a memory cell as will be described hereinafter, the transistors $T_1$ and $T_2$ being of the vertical or longitudinal type while the transistors $T_3$ through $T_6$ are of the lateral type.

More specifically, the longitudinal transistor $T_1$ includes an emitter, a base and a collector region formed of the N, P and N type regions 16 or $N_1$, $P_1$ and $N_2$ respectively and the longitudinal transistor $T_2$ includes an emitter, a base and a collector region formed of the N, P and N type regions $N_1$, $P_2$ and $N_2$ respectively. Similarly, the lateral transistor $T_3$ includes an emitter, a base and a collector region formed of the P, N and N type regions $P_3$, $N_1$ and $P_1$ respectively and the lateral transistor $T_4$ includes an emitter, a base and a collector region formed of the P, N and P type regions $P_3$, $N_1$ and $P_2$ respectively. Also the lateral transistor $T_5$ includes an emitter, a base and a collector region formed of the P, N and P type regions $P_5$, $N_1$ and $P_1$ respectively and the lateral transistor $T_6$ includes an emitter, a base and a collector region formed of the P, N and P type regions P, $N_1$ and $P_2$ respectively.

As shown in FIG. 1, an internal electrical lead 18 has a point $C_1$ disposed in ohmic contact with the N type regions $N_3$ and a point $C_2$ disposed in ohmic contact with the P type region $P_1$ and another internal electrical lead 20 has a point $C_3$ disposed in ohmic contact with the N type region $N_2$ and a point $C_4$ disposed in ohmic contact with the P type region $P_2$. Also an external electrical lead 22 serving as a Y address line has a contact $C_5$ disposed in point contact with the P type region $P_3$, another external electrical lead 24 serving as a writing-in line BI has a point $C_7$ disposed in ohmic contact with the P type region $P_5$ and a separate external electrical lead 26 serving as a readout line BO has a point $C_6$ disposed in ohmic contact with the P type region $P_4$. An X address line is formed of the N+ type semiconductor layer 14 common to all the transistors.

Figure 3:
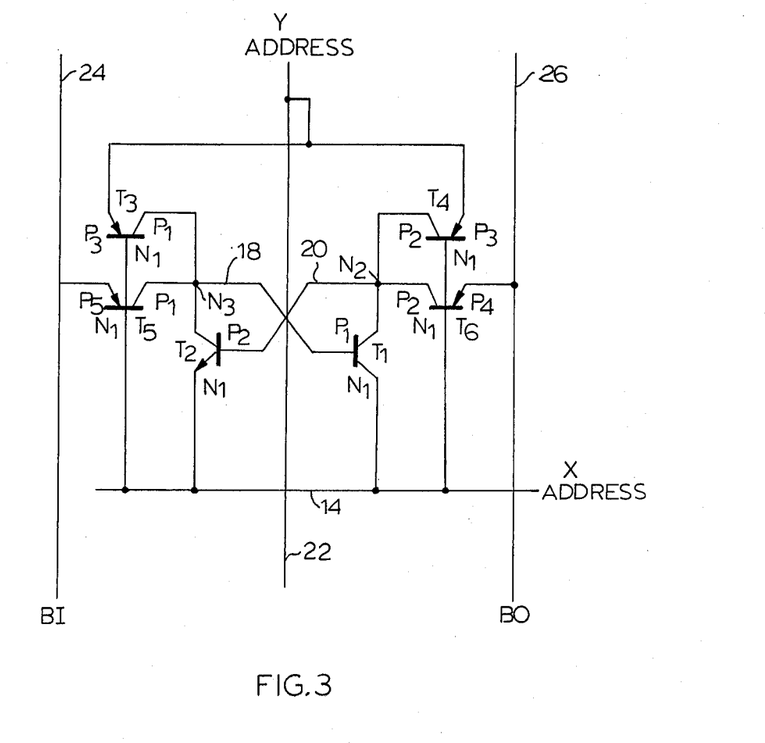
FIG. 3 is a schematic circuit diagram of a memory cell with which the present invention is concerned.

Therefore the transistors $T_1$, $T_2$, $T_3$, $T_4$ $T_5$ and $T_6$ are interconnected as shown in FIG. 3. As shown in FIG. 3, the NPN transistor $T_1$ has the base region $P_1$ connected to the collector region $N_3$ of the NPN transistor $T_2$ through the lead 18, the collector region $N_2$ connected to the base region $P_2$ of the NPN transistor $T_2$ through the lead 20 and the emitter region $N_1$ common to the emitter region $N_1$ of the transistor $T_2$ and connected to the X address line or the N+ type layer 14. Thus both transistors $T_1$ and $T_2$ operate the reverse of each other and form a flip-flop circuit of a memory cell designated by the reference characters MC in FIG. 1.

The PNP transistors $T_3$ and $T_5$ have the common collector region $P_1$ connected to the collector region $N_3$ of the NPN transistor $T_2$ and the common base region $N_1$ connected to the X address line or the N+ type layer 14. However the transistor $T_3$ has the emitter region $P_3$ connected to the Y address line 22 while the transistor $T_5$ has the emitter region $P_5$ connected to the writing-in line BI or 24. The PNP transistors $T_4$ and $T_5$ are connected to both the NPN transistor $T_1$ and the X and Y address lines in the same manner as do the PNP transistors $T_3$ and $T_5$ except that the emitter region $P_4$ of the transistor $T_6$ is connected to the reading-out line BO or 26. For example, the common collector region $P_2$ of the transistors $T_4$ and $T_6$ is connected to the collector region $N_2$ of the transistor $T_1$ through the lead 20.

The transistors $T_3$ and $T_4$ form load transistors and minority carriers injected from the P type region $P_3$ and collected in the P type regions $P_1$ and $P_2$ provide base current to the NPN transistors $T_1$ and $T_2$. The transistors $T_5$ and $T_6$ form bit line transistors.

Figure 4A:
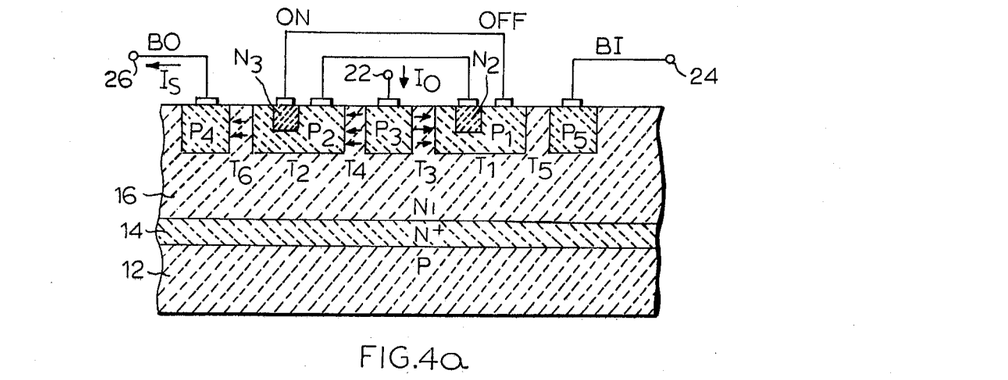
FIGS. 4a and 4b are views similar to FIG. 2 but additionally illustrating electrodes disposed on the arrangement shown in FIG. 2 and the interconnection thereof and which is useful in explaining the operation of that arrangement.

The operation of the arrangement as shown in FIGS. 1 and 2 will now be described with reference to FIGS. 4a and 4b which are replicas of FIG. 2 with electrodes and their connections added. In the readout mode of the operation as shown in FIG. 4a, it is assumed that the OFF state of the NPN transistor $T_1$ and therefore the ON state of the NPN transistor $T_2$ is to be read out. Under the assumed condition, a current of $I_o$ is supplied to the Y address line or the N+ type semiconductor layer 14 through the Y address lead 22. This tends to cause a flow of current through each of the PNP transistors $T_3$ or $T_4$. That is, the current from the P type region $P_3$ flows into the P type regions $P_1$ and $P_2$ through the N type region $N_1$ as shown by the arrows in FIG. 4a. Since the transistor $T_2$ is in its ON state, that portion of the current which reaches the P type region $P_1$ will directly flow into the N+ type layer 14 through the now conducting transistor $T_2$.

On the other hand, the remaining portion of the current having flowed into the P type region $P_2$ is effective for injecting carriers into the N type region $N_1$ of the transistor $T_6$ through the $P_2$-$N_1$ junction of the latter, because the transistor $T_1$ is in its OFF state. Then one portion of the injected carriers is collected in the P type region $P_4$ of the transistor $T_6$ as shown by the arrows in FIG. 4a. As a result, a current of $I_s$ is taken out through the readout line BO 26 as shown in FIG. 4a. The appearance of the current $I_s$ in the line BO indicates that the OFF state of the transistor $T_1$ has been read out. Therefore the transistor $T_2$ is in its ON state.

Figure 4B:
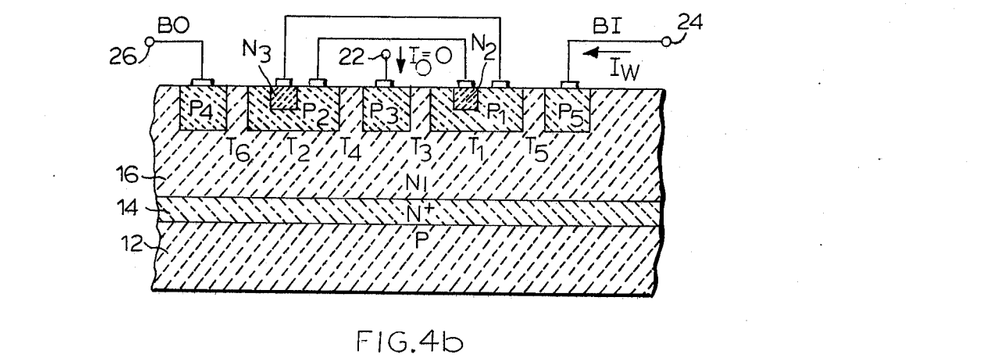

With the transistors $T_1$ and $T_2$ maintained in the OFF and ON states respectively, it is assumed that the writing-in operation is performed to invert the operating states of both transistors $T_1$ and $T_2$. Under the assumed condition it is required only to supply a writing-in current of $I_w$ in the form of a pulse to the P type region $P_5$ through the writing-in line BI 24 while the current of $I_o$ from the Y address line 22 is maintained substantially null as shown in FIG. 4b.

This current pulse of $I_w$ causes a flow of current from the P type region $P_5$ of the transistor $T_5$ into the P type region $P_1$ of the transistor $T_1$. This results in the turning on of the transistor $T_1$ attended by the turning off of the transistor $T_2$.

In the semiconductor memory device with the IIL configuration as above described in conjunction with FIGS. 1, 2, 3 and 4, no pair of adjacent memory cells is required to be electrically isolated from each other in a direction in which the N+ type layer 14 is extended or in which the P type region $P_3$ is opposite to the P type regions $P_1$ and $P_2$. Also, in each of the memory cells the transistors $T_1$, $T_2$, $T_3$, $T_4$, $T_5$ and $T_6$ are not required to be electrically isolated from one another. This ensures that the degree to which the circuit can be integrated can be increased due to the fact that the memory cells and the transistors need not be isolated from one another.

In addition, the number of contact points required per memory cell can be reduced to 5.5 although the seven contact points $C_1$ through $C_7$ for each of the memory cells are shown in FIG. 1. This is because the bit lines BO and BI can be common to each pair of adjacent memory cells. Also the three external leads 22, 24 and 26 are common to all the memory cells and therefore the number of such leads required per cell is 1.5.

From the foregoing it will readily be appreciated that the area necessary for each cell is minimized or substantially reduced resulting in the possibility of improving the degree of integration. This can be attended by a simplification of both mask patterns for the isolation and wiring of elements to be isolated and the manufacturing process.

However it has been found that conventional semiconductor memory devices with the IIL configuration having poor electrical characteristics. For example, they have included lateral transistors having a low efficiency of injection of carriers and poor frequency characteristics. This is because such semiconductor memory devices perform their operations principally under the control of the operation of the lateral transistors $T_3$ through $T_6$. Therefore it has been difficult to provide semiconductor memory devices with the IIL configuration which have high performance ratings.

Figure 5:
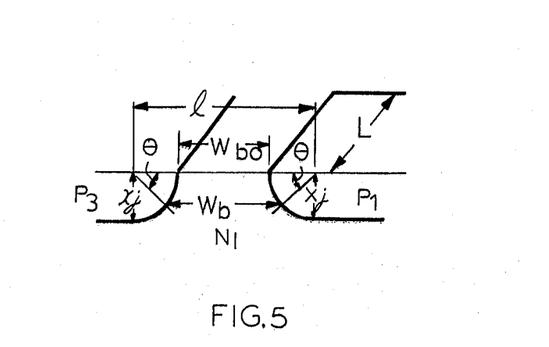
FIG. 5 is a substantially perspective view, on an enlarged scale, of one portion of the arrangement shown in FIG. 2 in order to explain the characteristics of that arrangement.

The reasons for which the lateral transistor included in conventional semiconductor devices having the IIL configuration has a low efficiency of injection of carriers and poor frequency characteristics will now be described with reference to FIG. 5 wherein only one portion of the lateral transistor $T_3$ shown in FIGS. 1 and 2 is illustrated in an exaggerated form. In FIG. 5, the P type regions $P_1$ and $P_3$ have been formed to a diffusion depth of $x_j$ in the N+ type layer $N_1$ by selectively diffusing a P type impurity into the layer $N_1$ with a pattern spacing of 1 between the P type regions $P_1$ and $P_3$. Both P type regions $P_1$ and $P_3$ have their lateral diffusion edges opposite to and spaced away from each other by a distance less than the pattern spacing of 1. Assuming that each of the lateral diffusion edges has a cross sectional profile in the form of one quarter of a circle having its center at each end of the pattern spacing on the exposed surface of the N+ type layer $N_1$ and a radius of $x_j$, the effective width $Wb$ of the base region of the lateral transistor $T_3$ is expressed by $$Wb = 1 - 2x_j \cos\theta$$

where $\theta$ designates the angle formed between the normal to the lateral diffusion surface and the exposed surface of each of the P type regions $P_1$ and $P_3$ in the plane of FIG. 5. The effective base width has a minimum value of $Wbo$ on the surface of the N+ type layer $N_1$ corresponding to $\theta = 0$. Thus the minimum value $Wbo$ of the effective base width is expressed by $$Wbo = 1 - 2x_j$$

It is well known that transistors generally have a frequency characteristic and injection efficiency proportional to $1/Wb^2$. Therefore, it is desirable to make the effective base width $Wb$ as small as possible. However this effective base width is directly affected by the accuracy of the pattern spacing 1 and the accuracy of the particular mask itself, the accuracy of mask registration, the side etching permitted by the photo-resist film involved etc. This leads to the necessity of imparting a greater or lesser tolerance to the pattern spacing and therefore it becomes difficult to make the effective base width sufficiently small. In addition, the resulting effective base width will vary considerably from one to another of the lateral transistors.

At present, the minimum value $Wbo$ of the effective base width can only be controlled within a range of from 1 to 2$\mu$m. Also lateral transistors generally have a current gain-band width frequency $f_T$ limited to from 20 to 30 MHz. Further the injection efficiency is determined by the area of that portion of one of the P type regions, for example, the P type region $P_1$ opposite to the other P type region or the region labelled $P_3$. This area is equal to the product of the diffusion depth $x_j$ of each of the opposite P type regions and the length of that portion of one of the regions opposite to the other region. The diffusion length is usually from 1 to 3 μm and accordingly the injection efficiency is also low.

The present invention seeks to eliminate the disadvantages of the prior art practice as above described while retaining the advantages of the IIL configuration well known in the art.

Figure 6:
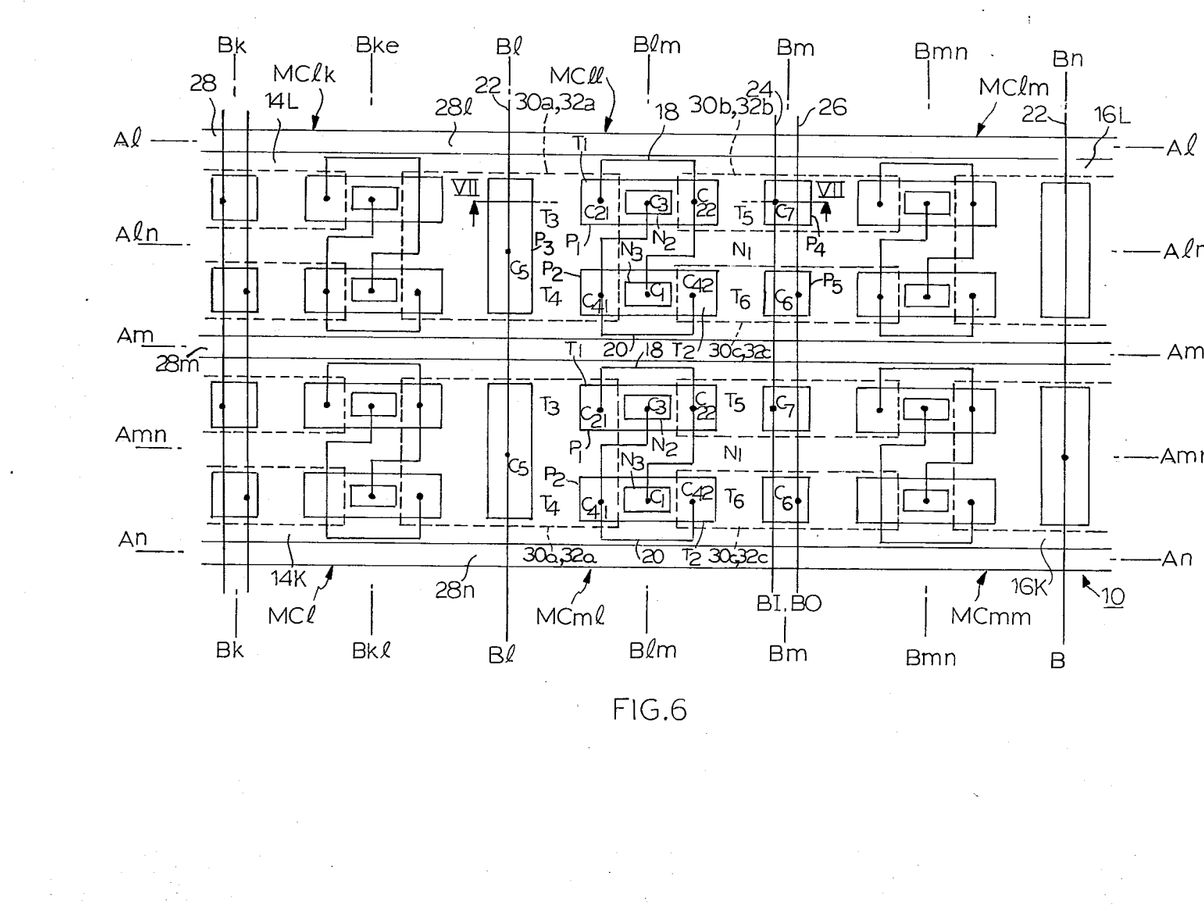
FIG. 6 is a fragmental plan view of a semiconductor memory device with an IIL configuration constructed in accordance with the principles of the present invention.
Figure 7:
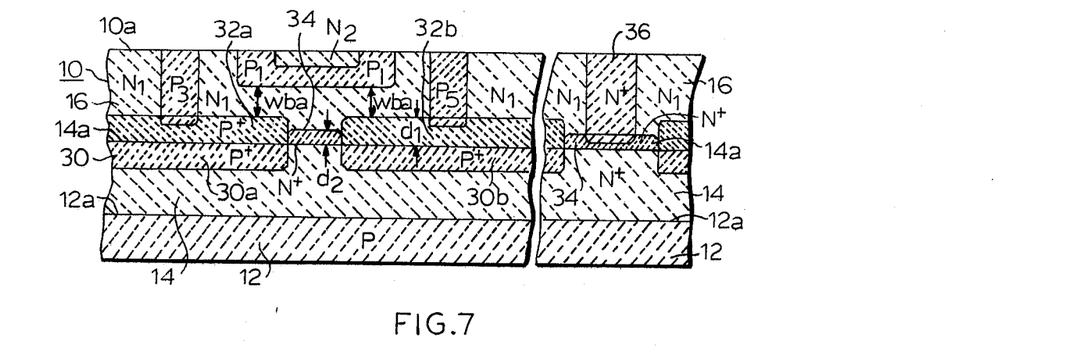
FIG. 7 is a fragmental sectional view as taken along the line VII — VII of FIG. 6 and developed in a plane.

Referring now to FIGS. 6 and 7 wherein like reference numerals and characters designate components identical to or corresponding to those shown in FIGS. 1 and 2, there is illustrated a semiconductor memory device with an IIL configuration constructed in accordance with the principles of the present invention. While the semiconductor memory device of the present invention comprises a multiplicity of memory cells disposed in the form of a matrix in a semiconductor substrate, FIG. 6 illustrates only three memory cells $MC_{lk}$, $MC_{ll}$ and $MC_{lm}$ disposed in a row between a pair of row lines Al and Am and three memory cells $MC_{mk}$, $MC_{ml}$ and $MC_{mm}$ disposed in another row between a pair of row lines Am and An only for purposes of illustration. Also the memory cells $MC_{lk}$ and $MC_{mk}$ are disposed in a column between a pair of column lines Bk and Bl in the memory cells $MC_{ll}$ and $MC_{ml}$ are disposed in another column between a pair of column lines Bl and Bm. Similarly the memory cells $MC_{lm}$ and $MC_{mm}$ are disposed in a separate column between pair of column lines Bm and Bn. In the example illustrated, this pairs of memory cells disposed on both sides of each row line are symmetrical with respect to that column line positioned therebetween. However all the memory cells are essentially of the same construction while each of the memory cells includes an upper half symmetrical with respect to its lower half about an associated transverse line centrally positioned between and parallel to the pair of adjacent row lines disposed on both sides thereof, that is to say, the central line labelled Aln or Amn in FIG. 6. Thus FIG. 7 shows in section an upper half of the memory cell $MC_{ll}$ as cut along the line VII – VII of FIG. 6.

As best shown in FIG. 7, the arrangement illustrated in FIG. 6 comprises body of semiconductive material in the form of a sheet generally designated by the reference numeral 10 and including a P type semiconductor substrate 12 forming the lowermost layer of the body 10, an N+ type embedded semiconductor layer 14 disposed on one of main opposite faces in this case, the main upper face 12a as viewed in FIG. 1 of the lowermost layer 12 and an N type semiconductor layer 16 or $N_1$ disposed on the main upper face 14a as viewed in FIG. 7 of the embedded semiconductor layer 14 so as to be exposed as the main upper face 10a of the body 10.

The arrangement further comprises a plurality of separation layers 28 of P type semiconductive material such as layers 28l, 28m and 28n in the form of strips extending along the respective row lines, for example, the row lines Al, Am and An as shown in FIG. 6. The separation layers 28 extend from the main upper face 10a to the lowermost layer 12 of the body 10 to separate each of the N+ and N type layers 14 and 16 into zones elongated in the direction of the rows in of the body 10. For example, the P type separation layer 28m is shown in FIG. 6 as separating that portion of the N+ type layer 14 sandwiched between the adjacent row lines Al and An into two separated zones 14L and 14K while forming two separate zones 16L and 16K of the N type layer 16 underlaid by the zones 14L and 14K. Those zones extend in the form of relatively narrow strips between the adjacent separation layers such as the layer 28l, 28m and 28n.

As shown by the dotted lines in FIG. 6, each of the zones such as the zone 14L or 14K of the N+ type layer 14 has a multiplicity of embedded P+ type semiconductor layers 30 having same predetermined pattern and disposed in tandem on the main face 14a of the N+ type layer and extending to equal depths within the N+ type layer 14 as shown in FIG. 7. Each P+ type layer 30 includes a relatively large rectangular island 30a and a pair of elongated rectangular islands 30b and 30c of similar shape extending lengthwise of the associated separated zone such as the zone 14L or 14K and having outer longer sides substantially flush with the adjacent sides of the island 30a and parallel to the separation layer. The remaining portion of the N+ type layers 14 remains intact. Each memory cell includes one half of the islands 30a, 30b and 30c.

As best shown in FIG. 7, each zone such as the zone 16L or 16K of the N type layer 16 has a multiplicity of sets of discrete P+ type re-diffusion islands 32a, 32b and 32c formed by the re-diffusion of the P type impurity from the P+ type islands 30a, 30b and 30c into the N type layer 16 and an N+ type re-diffusion layer 34 resulting from the re-diffusion of an N type impurity included in the N+ type layer 14 into the N type layer 16 with PN junction formed between the P type islands 32a, 32b and 32c and the N type layer 16. Thus the three P+ type rediffusion islands 32a, 32b and 32c in both pattern and shape to the P+ type islands 30a, 30b and 30c while the N+ type rediffusion layer 34 is disposed on the entire surface of the N type layer 16 contacting the main face 14a of the N+ type layer 14 except for the areas occupied by the P type islands 32a, 32b and 32c. It is to be noted that the depth $d_1$ of the P type re-diffusion islands 32 measured from the main face 14a is larger than the depth $d_2$ of the N+ type re-diffusion layer 34 measured from the same face.

As best shown in FIG. 6, a multiplicity of arrays of discrete P type semiconductor regions $P_1$, $P_2$, $P_3$, $P_4$ and $P_5$ each having a predetermined common pattern are disposed in tandem on the main surface 10a of the body, i.e. in the N type layer 16, in each of the separate zones such as the zone 16L or 16K to form a PN junction between the regions $P_1$-$P_5$ and the N type layer 16. The array of the P type regions $P_1$ through $P_5$ is similar to that shown in FIG. 1. For example, the P type region $P_1$ is spaced away from and aligned with the P type region $P_2$ widthwise of the separate zone and the P type region $P_3$ is disposed on one side of the regions $P_1$ and $P_2$. However it is to be noted that the P type region $P_1$ is opposite to both the adjacent end portion of the P type islands 32a and 32b and that portion of the N+ type re-diffusion layer 34 positioned therebetween as shown in FIG. 7. Similarly the P type region $P_2$ is opposite to both the adjacent end portions of the P+ type islands 32a and 32c and that portion of the N+ type re-diffusion layer 34 located therebetween. As shown in FIG. 7, the P type region $P_1$ is spaced from each of the opposite P+ type islands 32a and 32b in the direction of thickness of the N type layer 16. The spacing between the P type region $P_1$ and each of the P+ type islands 32a and 32b is Wba which is less than the space between the P type region $P_1$ and the N+ type layer 34. Similarly the P type region $P_2$ is spaced from the P+ type islands 32a and 32c by a spacing which is Wba less than the space between the same and that portion of the N+ type layer 34 positioned between the islands 32a and 32c. The P type regions $P_3$, $R_4$ and $P_5$ are only opposite to the P+ type islands 32a, 32b and 32c respectively. Further the P type region $P_3$ adjacent to the P type region $P_1$ extends in the direction of the thickness of the layer to the P+ type island 32a and the P type region $P_5$ adjacent to the P type region $P_1$ extends to the P type island 32b as shown in FIG. 7. Similarly the P type region $P_4$ extends to the P+ type island 32c.

Considering any pair of memory cells disposed adjacent to each other in the transverse direction as viewed in FIG. 6, the P type regions $P_1$, $P_2$ and $P_3$ are located in opposed relationship above the P+ type islands 30a and 32a respectively and also the P type regions $P_1$ and $P_5$ are located in opposed relationship above the P+ type islands 30b and 32b. Further the P type regions $P_2$ and $P_4$ are located in opposed relationship above the P+ type islands 30c and 32c.

The P type region $P_1$ includes an N type region $N_2$ disposed in a selected portion thereof so as to be exposed at the main face 10a of the body 10, i.e. the N type layer 16 or $N_1$, and to form a PN junction between the region $N_2$ and region $P_1$. The N type region $N_2$ is positioned in opposed relationship just above that portion of the N+ type layer 34 sandwiched between the associated P type islands 32a and 32b. Similarly, the P type region $P_2$ includes an N type region $N_3$ disposed in a selected portion thereof to be exposed to the main face 10a and at form a PN junction with region $P_2$. The N type region $N_3$ is positioned in opposed relationship just above that portion of the N+ type layer 34 sandwiched between the associated P type islands 32a and 32c.

In FIG. 6 it is noted that those components included in the memory cells $MC_{ll}$ and $MC_{ml}$ are designated by respective reference characters and numerals and the corresponding components included in the adjacent memory cells are not designated by the reference characters and numerals.

The P type regions $P_1$, $P_2$, $P_3$, $P_4$ and $P_5$ form a first, a second, a third, a fourth, a fifth and a sixth transistor with the n type layer $N_1$ and the N type regions $N_2$ and $N_3$ for each memory cell.

More specifically, the first transistor designated by $T_1$ includes an emitter, a base and a collector region composed of the N type layer $N_1$, the P type region $P_1$ and the N type region $N_2$ respectively to form a longitudinal NPN transistor while the second transistor designated by $T_2$ includes an emitter, a base and a collector region composed of the N type layer $N_1$, the P type region $P_2$ and the N type region $N_3$ respectively to form a longitudinal NPN transistor. The third transistor designated by $T_3$ includes an emitter region formed of the P type region $P_3$ and the P type island 32a, a base region formed of the N type layer $N_1$ and a collector region formed of the P type region $P_1$ respectively to form a lateral PNP transistor while the fourth transistor designated by $T_4$ includes an emitter region formed of the P type region $P_3$ and the P type island 32a, a base region formed of the N type layer $N_1$ and a collector region formed of the P type region $P_2$ to form a lateral PNP transistor. Similarly, the fifth transistor $T_5$ includes an emitter region formed of the P type region $P_5$ and the P type island 32b, a base region formed of the N type layer $N_1$ and a collector region formed of the P type region $P_1$ to form a lateral PNP transistor while the sixth transistor $T_6$ includes an emitter region formed of the P type region $P_4$ and the P type island 32c, a base region formed of the N type layer $N_1$ and a collector region formed of the P type region $P_2$ to form a lateral PNP transistor.

The main face 10a of the semiconductive body 10 is coated with an electrically insulating film (not shown) formed, for example, of silicon dioxide, silicon nitride or the like well known in the art, and electrical leads of any suitable metal such as aluminum or the like are disposed as desired upon the insulating film. The electrical leads include one pair of internal leads 18 and 20 for each memory cell and a multiplicity of sets of three external leads 22, 24 and 26. The internal lead 18 has a point $C_1$ disposed in ohmic contact with the N type region $N_3$ and a pair of spaced points $C_{21}$ and $C_{22}$ disposed on ohmic contact with the P type region $P_1$ through respective contact holes extending through the insulating film (not shown) while the internal lead 20 has a point $C_3$ disposed in ohmic contact with the n type region $N_2$ and a pair of spaced points $C_{41}$ and $C_{42}$ disposed in ohmic contact with the P type region $P_2$ through respective contact holes extending through the insulating film. The external leads 22 are disposed upon the insulating film (not shown) above alternate ones of the column lines such as lines B$l$ or B$n$ and are connected at points $C_5$ to the P type regions $P_3$ disposed in that column line through respective contact holes extending through the insulating film. Pairs of external leads 24 and 26 are disposed in parallel relationship upon the insulating film above the remaining column lines such as the line B$m$. The external lead 24 is connected at points $C_7$ to the P type regions $P_4$ disposed in that column line through respective contact holes extending through the insulating film while the external lead 26 is connected at points 6 to the P type regions $P_5$ disposed in the same column line through respective contact holes extending through the insulating film. The connection points on the leads are in ohmic contact with the respective semiconductor regions. The external lead 22 serves as a Y address line common to two rows of the memory cells located on both sides thereof. The external lead 24 serves as a bit line BI for writing in two rows of the memory cells located on both sides thereof and the external lead 26 serves as a bit line BO for reading out from two rows of the memory cells located on both sides thereof.

The separate zones of the N+ type layer 28, in the example illustrated, or the zones 14L and 14K can be used as X address lines. For example, the zone 14L serves as an X address line for all the memory cells located between the row lines A$l$ and A$m$. In order to make the electrical connection to the N+ type layer 24, an N+ type region 36 extends from the main face 10a through the layer 16 to an associated portion of the N+ type re-diffusion region 34 as shown at the righthand end portion of FIG. 7 while an ohmic contact (not shown) is diposed on that portion of the main face 10a to which the N+ type region 36 is exposed. This N+ type region 36 may also form a collector wall for each of the longitudinal PNP transistors $T_1$ or $T_2$.

The separate zones such as the zones 16L and 16M of the N type layer 16 can be directly used as the X address lines, if desired. In this case, it is required only to dispose contacts for the zones in ohmic contact with the main face 10a although such contacts are not shown only for purposes of simplifying the illustration.

In FIG. 6 it is seen that each of the memory cells has an electric circuit quite identical to that shown in FIG. 3. For example, the longitudinal transistors $T_1$ and $T_2$ form a flip-flop circuit. Thus the reading-out and writing-in operations are performed in the same manner as above described in conjunction with FIGS. 4a and 4b.

In the present invention, the lateral transistors are greatly improved with respect to both frequency characteristics and injection efficiency. It is to be noted that in each of the memory cells of the present invention the P type region $P_1$ is opposite to the P type regions $P_3$ and $P_5$ in the transverse direction or in a direction parallel to the main face 10a of the semiconductive body 10 while opposing to the P+ type re-diffusion regions 32a and 32b in the direction of thickness of the body 10. Also the P type region $P_2$ is opposite to the P type regions $P_3$ and $P_4$ in the transverse direction while opposing the P+ type re-diffusion regions 32a and 32c in the thickness direction. Further the P+ type island 32a is connected to the P type region $P_3$ and the two serve as the emitter region of each of the lateral transistors $T_3$ and $T_4$. Similarly the P+ type island 32b is connected to the P type region $P_5$ and the two serve as the emitter region of the lateral transistor $T_5$. Also the P+ type island 32c is connected to the P type region of the lateral transistor $T_6$. Thus the connection of the P+ type islands 32a, 32b and 32c to the respective P type regions $P_3$, $P_5$ and $P_4$ causes a great improvement in the frequency characteristic and a great increase in injection efficiency of the transistors $T_3$, $T_4$, $T_5$ and $T_6$.

More specifically the spacing between each of the P type regions $P_1$ or $P_2$ and the P+ re-diffusion islands 32a and 32b or 32c opposed thereto as viewed in the direction of the thickness of the body 10, that is to say, the thickness W$ba$ of that portion of the N type layer 16 or N located therebetween can to controlled so as to be a sufficiently small thickness with a high degree of accuracy as compared with the lateral spacing between each of the P type regions $P_1$ or $P_2$ and the P type region $P_3$ or each of the P type regions $P_5$ or $P_4$, that is to say, the base width W$b$ as above described in conjunction with FIG. 5. Thus it is possible to substantially determine the effective base region by the base dimension W$ba$. While the lateral base width W$b$ in the prior art structure has a maximum possible magnitude W$bo$ limited to from 1 to 2 $\mu$m the corresponding base dimension W$ba$ in the present invention can be controlled so as to be 1$\mu$ or less with a sufficiently high accuracy. The base dimension W$ba$ is equal to the thickness of the N type layer 16 minus the sum of the diffusion depth $d_I$ of the P+ type islands 32 and the diffusion depth $x_j$ of the P type regions $P_1$ and $P_2$ and therefore it can be made small with a high degree of accuracy by controlling the diffusion depths $d_I$ and $x_j$. By reducing that longitudinal base thickness W$ba$ to a sufficiently small magnitude with a high accuracy, the frequency characteristic of the lateral transistors $T_3$, $T_4$, $T_5$ and $T_6$ can be greatly improved.

In addition, the transistors $T_3$ and $T_4$ are substantially symmetrical with respect to the transistors $T_5$ and $T_6$ respectively about the longitudinal line centrally positioned between each pair of adjacent column lines such as the central line B$kl$, B$lm$ or B$mn$. Thus the improvement in the frequency characteristic of the lateral transistors as above described can be attended by an increase in both the reading-out and writing-in speeds since the distances to corresponding parts of the memory cells will be equal to each other as viewed from either of the bit lines B$l$ and BO.

Further the addition of the P+ type islands 32a, 32b and 32c causes a great increase in the area of the emitter region of each of the lateral transistors $T_3$, $T_4$, $T_5$ and $T_6$ which is opposed to the collector region thereof resulting in a great increase in injection efficiency. Also the area of each of the P type regions $P_1$ or $P_3$ which is opposed to the P+ type islands 22a and 22b or 22c in the longitudinal direction as above described can easily be made equal to from about 10 to 100 times the area of the P type region $P_1$ or $P_2$ which is opposed to the P type regions $P_3$ and $P_5$ or $P_4$ in the transverse direction as above described.

The injection of carriers from the P+ type islands 30 and 32 into the N+ type layers 14 and 34 is preferably smaller than that from the P+ type islands 32 into the N type layer 16 or $N_1$. This is accomplished by giving the N+ type layer and islands 14 and 34 respectively a higher concentration of the N type impurity than the N type layer 16 or $N_1$ as will ready be understood from the following description.

The injection of minority carriers from one to the other of the P and N type regions disposed on both sides of a junction is generally determined by the equation $$NnPn = NpPp = Ni^2$$

where N$n$ and N$p$ are electron concentrations in the N and P type regions in their thermal equilibrium conditions respectively, P$n$ and P$p$ are hole concentrations of the N and P type regions in their thermal equilibrium conditions respectively and N$i$ is the concentration of each of electrons and holes in an intrinsic semiconductor. From the above equation it is seen that the number of holes injected from a P+ to an N type region through a P+N junction is greater than that injected from a P+ to an N+ type region through a P+N+ junction.

The arrangement as shown in FIGS. 6 and 7 can be produced according to the manufacturing steps as shown in FIG. 8a-8g wherein like reference numerals and characters designate the components identical to those shown in FIGS. 6 and 7. It is noted that the arrangement of FIG. 7 is produced in the order of FIGS. 8a, 8b, 8c, 8d, 8e, 8f and 8g.

Figure 8A:
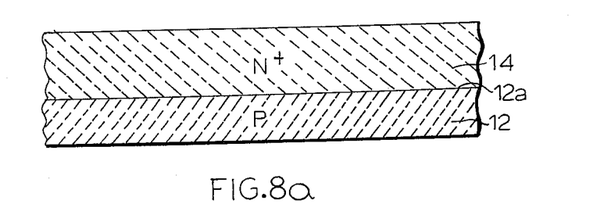
FIGS. 8a through 8g are fragmental sectional views illustrating the manufacturing steps of a process of manufacturing the semiconductor memory device of the present invention.

For producing the arrangement of FIG. 7, one first prepares a P type semiconductor substrate 12 having an N+ type semiconductor layer 14 epitaxially grown on a main face 12a thereof as shown in FIG. 8a. In the example illustrated, the substrate 12 has a thickness of from 200 to 300 $\mu$ and a resistivity of from 10 to 40 ohms-centimeter and the N+ type semiconductor layer 14 has a thickness of from 5 to 10 $\mu$ and a resistivity of from 0.01 to 0.1 ohm-centimeter. The N+ type layer 14 is formed of silicon including a suitable amount of phosphorus as an N type impurity.

Figure 8B:
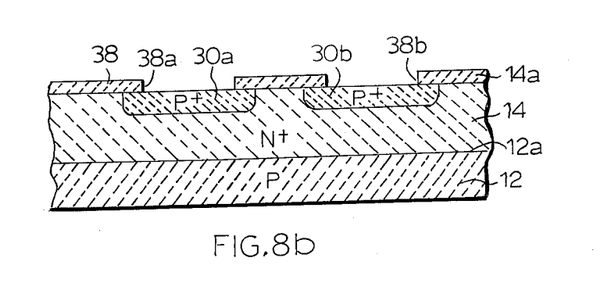

Then the N+ type layer 14 is provided on the main face 14a with a diffusion mask 38 formed, for example, of a silicon dixoide film followed by the formation of diffusion holes 38a and 38b thereon by photoengraving. A P type impurity such as boron is diffused into the N+ type layer 14 through the diffusion holes 38a and 38b to form P+ type islands 30a and 30b having a diffusion depth of from 2 to 3 $\mu$ and an impurity concentration of about 1 × 10$^{18}$ atoms per cubic centimeter on the surface thereof. The resulting structure is shown in FIG. 8b. The structure also includes the P+ type island 30c as above described which has been formed simultaneously with the formation of the islands 30a and 30b although the P+ type island 30c is not illustrated.

Following this, the diffusion mask 38 is removed from the main face 12a of the N+ type layer 14 after which an N type semiconductor layer 16 is epitaxially grown upon the main face 14a. The grown layer 16 has a thickness of 6 μ and a resistivity of from 0.5 to 1 ohm-centimeter. This growth of the N type layer 16 or $N_1$ is accompanied by the re-diffusion from the P+ type islands 30a, 30b and 30c and the N+ type layer 14 into the N type layer 16 or $N_1$ to form P+ type islands 32a, 32b and 32c and an N+ type layer 34 although the P+ type island 32c is not illustrated. These P+ type islands have a diffusion depth $d_1$ of 3 μ while the N+ type layer 34 has a diffusion depth $d_2$ of 1 μ.

Since, in this case, the P type impurity included in the P+ type islands 30a, 30b and 30c is boron which has a higher in diffusion coefficient than phosphorus included as the N type impurity the N+ type layer 14, the dimension $d_1$ is greater than the dimensions $d_2$ as above described in conjunction with FIG. 7. If desired, antimony may be substituted for the boron with a similar result.

Figure 8C:
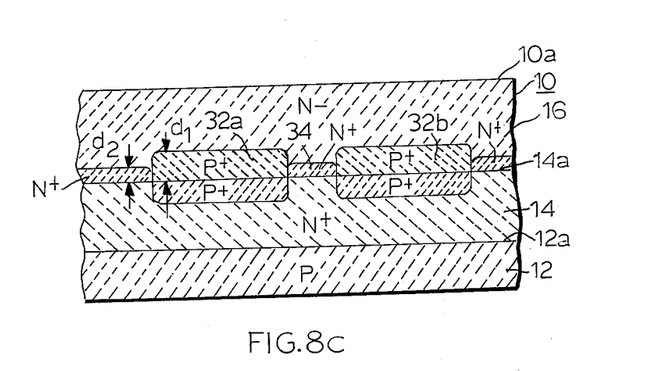

The resulting structure is shown in FIG. 8c.

Figure 8D:
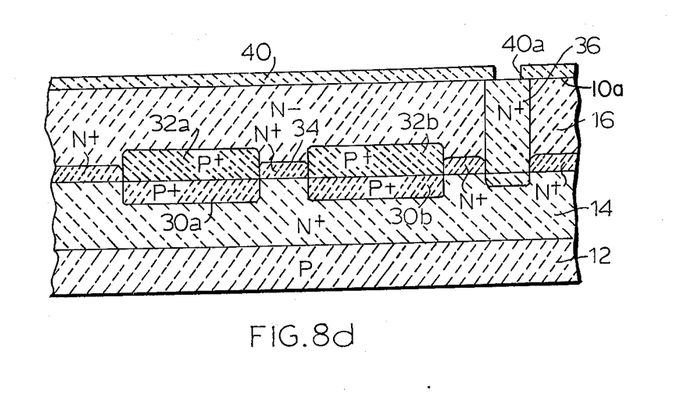

In order to dispose an ohmic contact for this N+ type re-diffusion layer 34 on the main face 10a, the latter has applied thereto a diffusion mask 40 similar to the diffusion mask 38 and a diffusion hole 40a is formed in the diffusion mask 40 at a position just above the predetermined position of the N+ type layer 36. Then an N type impurity such as phosphorus is selectively diffused into the N type layer $N_1$ or 16 through the diffusion hole 40a to form an N+ type region 36 reaching the N+ type layer 34. The N+ type region 36 is shown in FIG. 8d as extending through the N type layer 16 and the N+ type region 34 until its lower end somewhat extends into the N+ type layer 14. The N+ type region 36 has a diffusion depth of say 7 μ and an impurity concentration of $1 \times 10^{19}$ atoms per cubic centimeter on the surface thereof.

Figure 8E:
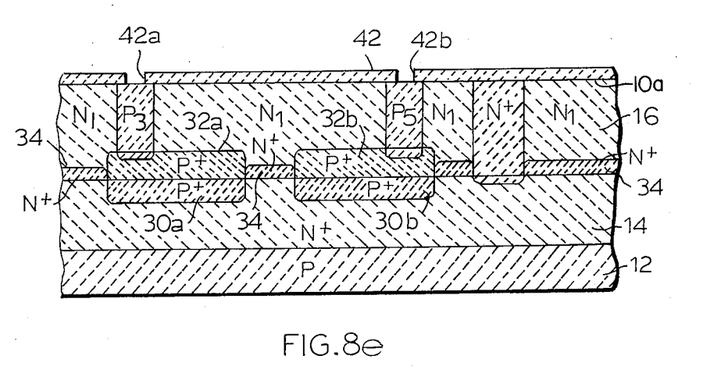

After the diffusion mask 40 has been removed from the main face 10a of the N type layer 16 or $N_1$, another diffusion mask 42 similar to the mask 38 or 40 is applied to the main face 10a and a plurality of diffusion holes for the P type layer $P_3$, $P_4$ and $P_5$ such as holes 42a and 42b are formed in a predetermined pattern in the diffusion mask 42 in a manner well known in the art. Then a P type impurity, in this case, boron is selectively diffused into the N type layer 16 or $N_1$ through those diffusion holes to form P type regions $P_3$, $P_4$ and $P_5$ reaching the P+ type islands 32a, 32b and 32c, although the P type region $P_4$ and the P+ type island 22c are not illustrated. Each of those P type regions has a diffusion depth of 4 μ impurity concentration of $1 \times 10^{19}$ atoms per cubic centimeter on the surface thereof.

The resulting structure is shown in FIG. 8e.

Figure 8F:
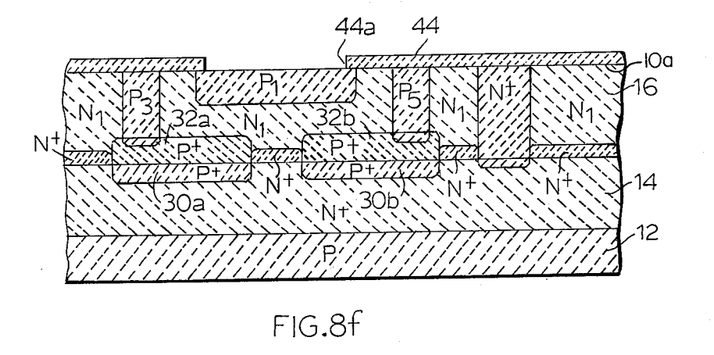

After the removal of the diffusion mask 42 from the main face 10a of the N type layer 16 or $N_1$, a separate diffusion mask 44 similar to the diffusion masks as above described is applied to the main face 10a. Following this, a P type impurity, for example, boron is selectively diffused into the N type layer 16 or $N_1$ through diffusions holes such as a hole 44a on the diffusion mask 36 to form P type regions $P_1$ and $P_2$. Each of the P type regions $P_1$ or $P_2$ has a diffusion depth of 2 μ and an impurity surface concentration of $1 \times 10^{19}$ atoms per cubic centimeter on the surface thereof while being spaced from the P+ type islands 32a and 32b or 32c by a distance of W$ba$ in this case, 1 μ.

A structure thus formed is shown in FIG. 8f wherein the P type region $P_2$ and the P+ type island 32c are not illustrated.

Figure 8G:
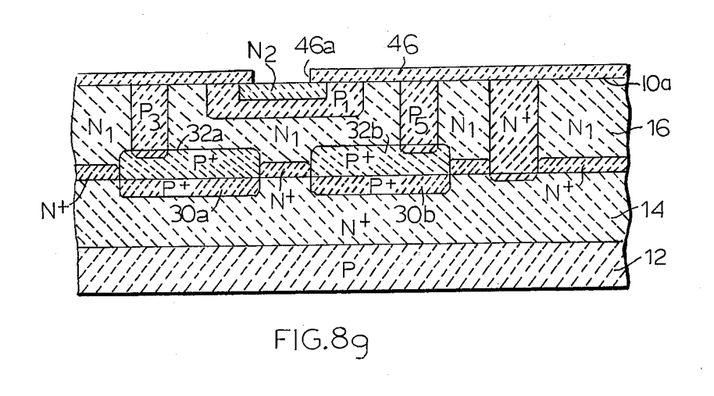

The diffusion mask 44 is removed from the arrangement of FIG. 8f and N type regions $N_2$ and $N_3$ are disposed in selected portions of the P type regions $P_1$ and $P_2$ respectively by a selective diffusion technique employing a similar diffusion mask 46 with diffusion holes such as a hole 46a and phosphorus that is an N type impurity. Each of the N type regions $N_2$ and $N_3$ has a diffusion depth of 1.5 μ and a surface impurity concentration of $1 \times 10^{21}$ atoms per cubic centimeter.

The resulting structure is shown in FIG. 8g except for the N type region $N_3$.

While the process of manufacturing a single memory cell and more particularly the components around the line VII — VII of FIG. 6 has been illustrated and described in conjunction with FIGS. 8a through 8g it is to be understood that the manufacturing steps as shown in FIGS. 8b, 8c, 8d, 8e, 8f and 8g may be seccessively applied to the main face 10a of the N+ type layer 16 in its entirety to form the arrangement of FIG. 6 except for the electric leads 18, 20, 22, 24 and 26.

After the N type semiconductor layer 16 underlaid by the P type semiconductor substrate 14 has been provided with all the required semiconductor layers and regions as above described, the main face 10a thereof is coated with any suitable, electrically insulating film. After having been provided with small openings at predetermined positions such as points $C_1$, $C_3$, $C_5$, $C_6$, $C_7$ etc. (see FIG. 6), the insulating film has applied thereto a metallic film formed for example by evaporating aluminum thereon. Then the metallic film is selectively etched away to form leads 18, 20, 22, 24 and 26 disposed in ohmic contact with predetermined portions of the main face 10a of the semiconductor body 10.

Figure 9:
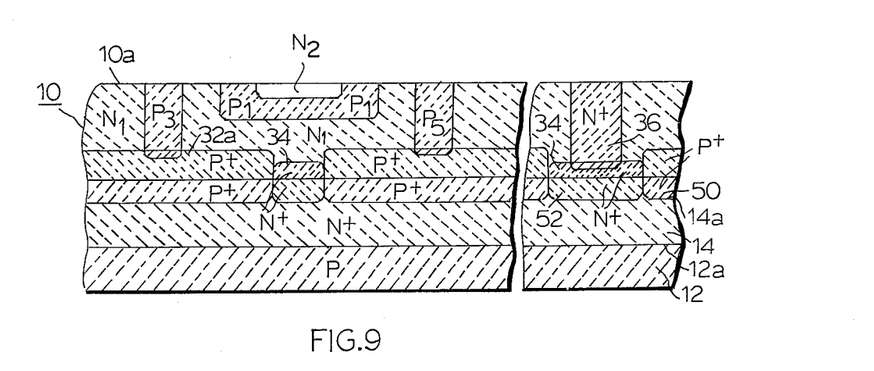
FIG. 9 is a view similar to FIG. 7 but illustrating a modification of the present invention.

FIG. 9 wherein like reference numerals characters designate the components identical to those shown in FIG. 7 illustrates a modification of the present invention. The arrangement illustrated is different from that shown in FIG. 7 only in that in FIG. 9 an epitaxially grown layer 50 of P+ semiconductive material highly doped with boron is interposed between the N+ type semiconductor layer 14 and the N type semiconductor layer 16 and includes $N^{30}$ type semiconductor regions 52 disposed at predetermined portions thereof to contact the main face 14a of the N+ type semiconductor layer 14 overlaid by the layer 50 and regions 52. The N+ type regions 52 includes phosphorous as an N type impurity.

When the N type semiconductor layer 16 is being grown upon the p+ type semiconductor layer 50 and the N+ type semiconductor regions 52, the P and N type impurities included in the layer 50 and the regions 52 respectively are re-diffused into the layer 16 being grown to form the P+ type semiconductor islands 32a, 32b and 33c and the N+ type semiconductor regions 34. Thus the layer 50 and the regions 52 perform the operation of the P+ types islands 30 and the N+ type layer 14 as shown in FIG. 7.

In summary, the present invention provides a semiconductor memory device comprising a pair of transistors extending in the thickness direction of the device and interconnected in a flip-flop circuit and a pair of lateral transistors for performing the reading-in and writing-in operation with respect to the flip-flop circuit, each of the lateral transistors including an emitter region having one portion opposed to the base region of a corresponding one of the thickness direction transistors through a semiconductor region common to both transistors in the direction of the thickness of the device. Therefore the lateral transistors have a greatly improved frequency characteristic and increased efficiency of injection of carriers resulting in a semiconductor memory device having a good performance.

While the present invention has been illustrated and described in conjunction with a few preferred embodiments thereof, it is to be understood that numerous changes and modifications may be resorted to without departing from the spirit and scope of the present invention. For example, the lateral transistors $T_3$ and $T_4$ for performing the addressing operation may be omitted, if desired. Also current pulses from the Y address line may be directly supplied to the internal leads 18 and 20. Further it is possible to invert the conductivity of the various components to that which is the reverse from the conductivity illustrated.

What is claimed is:

1. A semiconductor memory device including at least one memory cell having a flip-flop circuit formed of a first and a second transistor to perform the storing operation, and a third transistor and a fourth transistor for performing the writing-in operation and read-out operation with respect to said memory cell, which device comprises a substrate of semiconductive material having a pair of main opposite faces and including a first semicondutor region of a first type conductivity disposed therein and exposed to one of said main faces, a second semiconductor region and a third semiconductor region having a second type conductivity and disposed in said substrate and exposed to said one main face, each of said second and third semiconductor regions forming a junction between the same and said first semiconductor region, a fourth semiconductor region of the first type conductivity disposed in said substrate and exposed to said one main face and forming a junction between the same and said second semiconductor region, a fifth semiconductor region of the first type conductivity disposed in said substrate and exposed to said one main face and forming a junction between the same and said third semiconductor region, a sixth semiconductor region of the second type conductivity disposed in said substrate and having a portion opposed to said second semiconductor region through said first semiconductor region other than that portion thereof opposite to said fourth region and in a direction of thickness of said substrate, a seventh semiconductor region of the second type conductivity disposed in said substrate and including a portion opposed to said third semiconductor region through said first semiconductor region other than that portion thereof opposite to said fifth region and in the direction of thickness of said substrate, and an eighth semiconductor region of the first type conductivity disposed in said substrate opposed to said fourth and fifth regions through said first region and said second and third regions respectively in the direction of thickness of said substrate, said eighth region having a higher impurity concentration than said first region, and said device further comprising first connection means for electrically connecting said second region and said fifth region together, second connection means for electrically connecting said third region and said fourth region together, an X address line connected to said eighth region, A Y address line for supplying a current to said first and second connection means, a first write-in-read-out line connected to said sixth region, and a second write-in-read-out line connected to said seventh region, said first, second, fourth and eighth semiconductor regions forming said first transistor, said first, third, fifth, and eighth semiconductor regions forming said second transistor, said connection means connecting said first and second transistors in a flip-flop circuit, said first, second and sixth semiconductor regions forming said third transistor, and said first, third and seventh semiconductor regions forming said fourth transistor.

2. A semiconductor memory device as claimed in claim 1 wherein said first type conductivity is an N type and said second type conductivity is a P type and wherein said first and second transistors are an NPN type and said third and fourth transistors are a PNP type.

3. A semiconductor memory device as claimed in claim 1 wherein each of said sixth and seventh semiconductor regions includes a second portion extending from said opposite portion of said one main face of said substrate, said second portion being opposed to said second and third semiconductor regions through said first semiconductor region along said one main face of substrate.

4. A semiconductor memory device as claimed in claim 1 wherein said substrate includes a undersubstrate of the second type conductivity, a highly doped semiconductor layer of the first type semiconductivity disposed upon said under-substrate and a low concentration semiconductor layer of the first type conductivity having a lower impurtiy concentration than the highly doped semiconductor layer and disposed upon the latter, said low concentration semiconductor layer forming said first semiconductor layer, that surface of said low concentration semiconductor layer remote from said highly doped semiconductor layer forming said one main face of said substrate.

5. A semiconductor memory device as claimed in claim 4 wherein said sixth and seventh semiconductor layers have said opposite portions interposed between said highly doped semiconductor layer and said low concentration semiconductor layer.

6. A semiconductor memory device as claimed in claim 4 wherein each of said second and third semiconductor layers is spaced in the direction of the thickness of said substrate from the adjacent one of said sixth and seventh semiconductor layers a distance less than the distance by which each of said second and third semiconductor layers is spaced in the direction of the thickness of said substrate from the highly doped semiconductor layer.

7. A semiconductor memory device as claimed in claim 4 wherein said semiconductor substrate is formed essentially of silicon, said highly doped semiconductor layer is highly doped with phosphorous and said sixth and seventh semiconductor layers are highly doped with boron.

8. A semiconductor memory device as claimed in claim 1 wherein said device includes a plurality of said memory cells disposed in a matrix, those memory cells arranged in one direction of the matrix include said first semiconductor region common thereto and those memory cells arranged in a second direction orthogonal to the first direction having separate portions of said first semiconductor region.

9. A semiconductor memory device as claimed in claim 8 wherein said sixth and seventh semiconductor regions are common to adjacent pairs of memory cells arranged in the first direction.

10. A semiconductor memory device as claimed in claim 8 wherein each of said memory cells includes a fifth transistor and a sixth transistor for addressing the same.

11. A semiconductor memory device as claimed in claim 10 wherein said semiconductor substrate further includes a ninth semiconductor region of the second type conductivity disposed therein and exposed to said one main face and opposed to each of said second and third semiconductor regions through said fifth semiconductor region, and wherein said fifth transistor is formed of said second, first and eighth semiconductor regions and said sixth transistor is formed of said third, first and eighth semiconductor regions.

12. A semiconductor memory device as claimed in claim 11 wherein said ninth semiconductor region includes a portion opposed to each of said second and third semiconductor regions in the direction of the thickness of said first semiconductor region.

* * * * *